United States Patent
Ma

(10) Patent No.: US 8,704,560 B2
(45) Date of Patent: Apr. 22, 2014

(54) MULTI-PHASE SIGNAL GENERATOR AND METHOD

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/049,264

(22) Filed: Mar. 16, 2011

(65) Prior Publication Data

US 2011/0163786 A1 Jul. 7, 2011

Related U.S. Application Data

(63) Continuation of application No. 12/245,407, filed on Oct. 3, 2008, now Pat. No. 7,911,245.

(51) Int. Cl.
*H03L 7/00* (2006.01)

(52) U.S. Cl.
USPC ........... 327/145; 327/144; 327/152; 327/153; 327/156

(58) Field of Classification Search
USPC ................... 327/141, 144–163; 331/15–17; 375/373–376
See application file for complete search history.

(56) References Cited

U.S. PATENT DOCUMENTS

| | | | |
|---|---|---|---|
| 6,304,116 B1 * | 10/2001 | Yoon et al. ................ | 327/158 |
| 6,801,472 B2 | 10/2004 | Lee ........................... | 365/233 |
| 6,996,026 B2 | 2/2006 | Brox et al. ................. | 365/233 |
| 7,084,686 B2 | 8/2006 | Zimlich ..................... | 327/291 |
| 7,106,655 B2 | 9/2006 | Lee ........................... | 365/233 |
| 7,426,145 B2 | 9/2008 | Lee et al. ................... | 365/189.05 |
| 7,706,210 B2 | 4/2010 | Kim et al. .................. | 365/233.1 |
| 7,812,656 B2 | 10/2010 | Lee ........................... | 327/158 |
| 7,872,924 B2 | 1/2011 | Ma ............................ | 365/189.05 |
| 7,911,245 B2 | 3/2011 | Ma ............................ | 327/145 |
| 7,965,582 B2 | 6/2011 | Kim et al. | |
| 8,008,954 B2 | 8/2011 | Ma ............................ | 327/153 |
| 8,111,580 B2 | 2/2012 | Ma | |
| 2004/0239389 A1 * | 12/2004 | Matsuno .................... | 327/158 |
| 2005/0093598 A1 * | 5/2005 | Jeon et al. .................. | 327/158 |
| 2008/0252340 A1 * | 10/2008 | Yeo et al. ................... | 327/156 |
| 2009/0195279 A1 * | 8/2009 | Lin ........................... | 327/161 |
| 2010/0013530 A1 * | 1/2010 | Kim et al. .................. | 327/149 |
| 2010/0085094 A1 | 4/2010 | Ma ............................ | 327/158 |
| 2010/0085099 A1 | 4/2010 | Ma ............................ | 327/295 |
| 2010/0103746 A1 * | 4/2010 | Ma ............................ | 365/189.05 |
| 2011/0109367 A1 | 5/2011 | Ma | |
| 2011/0169537 A1 | 7/2011 | Ma | |
| 2012/0119804 A1 | 5/2012 | Ma | |

OTHER PUBLICATIONS

Ki-Won Lee et al.; "*A 1.5-V 3.2 Gb/s/pin Graphic DDR4 SDRAM With Dual-Clock System, Four-Phase Input Strobing, and Low-Jitter Fully Analog DLL*"; IEEE Journal of Solid-State Circuits, vol. 42; No. 11; Nov. 2007; pp. 2369-2377.

* cited by examiner

*Primary Examiner* — Brandon S Cole

(74) *Attorney, Agent, or Firm* — Dorsey & Whitney LLP

(57) ABSTRACT

A multi-phase signal generators and methods for generating multi-phase signals are described. In one embodiment, a clock generator generates quadrature signals including those having 90, 180, 270 and 360 degrees phase difference with a first signal. The rising edge of an intermediate signal is compared with the rising edges of two of the other signals to generate an UP and DN pulse signal, respectively. The UP and DN signals are used to adjust the delay of a delay line producing the signals to synchronize the signals. In some embodiments, a reset signal generator is used to truncate the UP or DN signal pulse.

20 Claims, 7 Drawing Sheets

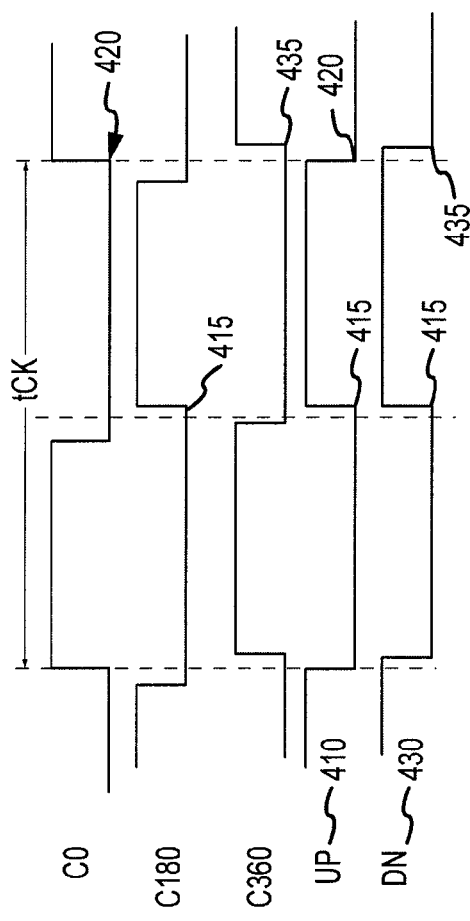
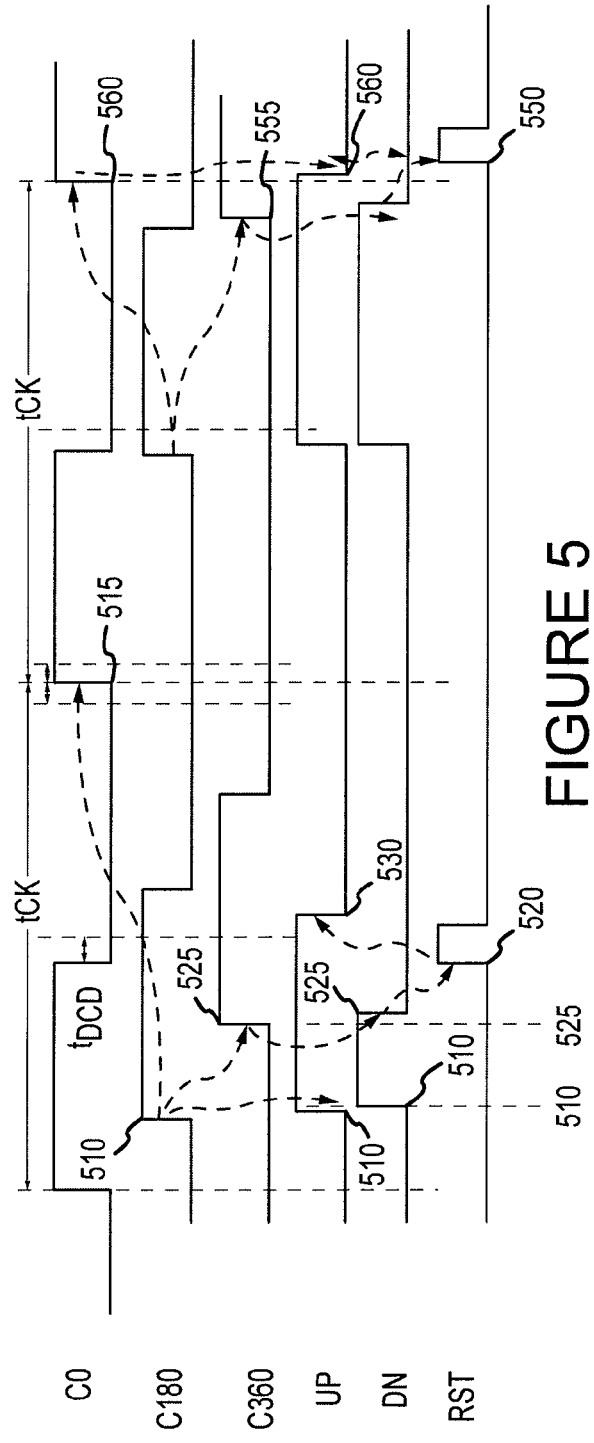

ND METHOD

CROSS REFERENCE TO RELATED APPLICATION(S)

This application is a continuation of U.S. patent application Ser. No. 12/245,407, filed Oct. 3, 2008, and issued as U.S. Pat. No. 7,911,245. This application and patent are incorporated herein by reference, in their entirety, for any purpose.

TECHNICAL FIELD

Embodiments of the invention relate generally to signal generating systems, and more particularly, in one or more embodiments to methods and systems for fast initializing a multi-phase clock signal generator.

BACKGROUND OF THE INVENTION

Periodic signals are used in a variety of electronic devices. One type of periodic signals are clock signals that can be used to establish the timing of a signal or the timing at which an operation is performed on a signal. For example, data signals are typically coupled to and from memory devices, such as synchronous dynamic random access memory ("SDRAM") devices, in synchronism with a clock or data strobe signal. More specifically, read data signals are typically coupled from a memory device in synchronism with a read data strobe signal. The read data strobe signal typically has the same phase as the read data signals, and it is normally generated by the same memory device that is outputting the read data signals. Write data signals are typically latched into a memory device in synchronism with a write data strobe signal. The write data strobe signal should have a phase that is the quadrature (having a phase 90-degrees relative to the phase) of the write data signals so that a transition of the write data strobe signal occurs during a "data eye" occurring at the center of the period in which the write data signals are valid.

Internal clock signals generated in electronic devices, for example, memory devices or memory controllers, are often synchronized or have some other controlled phase relationships relative to external or internal clock signals. For example, with reference to a memory device, a quadrature clock signal used for both latching write data and outputting read data may be generated in the memory device to which the data are being written. The quadrature clock signal is typically generated in the memory device from an internal clock signal that is also derived from the system clock signal.

Internal clock signals having synchronized or some other controlled phase relationships with external and internal clock signals may also be used for applications other than for use as a write data strobe signal. For example, a "frequency doubler" circuit, which generates an output clock signal having twice the frequency of an input clock signal, can be implemented using an appropriate logic circuit that receives the input clock signal and quadrature versions of the input clock signal. Internal clock signals may also be generated having other than a quadrature phase relationships. Generally, any phase relationship between output clock signals can be used.

Various techniques can be used to generate a quadrature clock signals or read/write data strobe signal. If the frequency of the internal clock signal is fixed, quadrature clock signals can be generated by a timing circuit that simply generates a transition of the quadrature clock signals a fixed time after a corresponding transition of the internal clock signal. However, synchronous memory devices are typically designed and sold to be operated over a wide range of clock frequencies. Therefore, it is generally not practical to use a fixed timing circuit to generate quadrature signals from the internal clock signal. Instead, a circuit that can adapt itself to an internal clock signal having a range of frequencies must be used.

An example of such a circuit is a multi-phase clock signal generator. A multi-phase clock signal generator, as known, generates multi-phase clock signals to provide several clock signals having fixed phase relationships to a reference clock signal, such as an external or internal clock signal. In operation, a multi-phase clock signal generator should be initialized to ensure the generated clock signals have the correct phase relationship. A conventional method of initializing a multi-phase clock signal generator will now be described with reference to FIG. 1. The conventional multi-phase clock signal generator 100 includes a delay line 105 having a plurality of delay elements 110*a-d* coupled in series with each other. Each of the delay elements 110*a-d* has two inputs, two outputs, and a control input (not shown). Each delay element 110*a-d* has two inputs and two outputs to provide for a double-ended configuration where both a clock signal 120 and its complement 121 are received and processed. A single-ended configuration may also be used.

Each of the delay elements 110*a-d* couples a signal from its input to its output with a delay corresponding to a delay control signal applied to its control input. The input of the initial delay element 110*a* receives a clock signal 120 and its complement 121. The outputs of all but the last delay element 110*d* is coupled to the input of the subsequent delay element. The output of each delay element 110*a-d* forms a respective tap of the delay line 105 to provide four clock signals C90, C180, C270, and C360, respectively C360 is a one clock delayed version of C0 at lock status. As indicated by their names, the C90 signal has a 90 degree phase difference with the input clock signal 120. The C180 signal has a 180 degree phase difference with the input clock signal 120, the C270 signal a 270 degree phase difference, and the C360 signal a 360 degree phase difference. As explained in greater detail below, the amount of voltage-controlled delay provided by each of the delay elements 110*a-d* sets a minimum and maximum amount of delay that can be achieved by the delay line 105.

To ensure the proper phase relationships are maintained between the four provided clock signals, a two-step locking phase detector 130 receives the input clock signal 120, the C180 signal and the C360 signal. The phase detector 130 will first lock the C180 signal to the C0 signal, and then in the second step, lock the C360 signal with the C0 signal. To lock the C0 and C180 signal, the phase detector 130 produces an error signal corresponding to a mismatch between the falling edge of the C180 signal and the rising edge of the C0 signal. The error signal is used to adjust the delay of the delay elements 110*a-d* such that the C0 and C180 signals are 180 degrees apart. As shown in FIG. 1, the error signal is converted to a control signal by a charge-pump and loop filter 140. The control signal is used by a bias voltage generator 150 to couple a $V_{BIAS}$ signal to the control inputs of the delay elements 110*a-d*. Once the rising edge of the C0 and the falling edge of the C180 signals are synchronized, in the second step of operation of the phase detector 130, an error signal is generated corresponding to a mismatch between a rising edge of the C0 signal and a rising edge of the C360 signal. In a similar manner, the error signal is used to adjust the delay of the delay elements 110*a-d*. This two-step locking process may be sufficient in some cases where the duty cycle of the signal is at or near 50 percent or slow locking time is not an issue. However, difficulties occur when the incoming clock signal contains some duty cycle distortion, as will now be explained with reference to FIG. 2.

FIG. 2 is a timing diagram illustrating signals from FIG. 1. A clock period is shown in FIG. 2 as $t_{CK}$, between $t_0$ and $t_2$. The incoming clock signal, C0 has an amount of duty cycle distortion shown by $t_{DCD}$. That is, in the case where the C0 signal had an ideal, 50 percent duty cycle, the high pulse would extend from time $t_0$ to time $t_1$ in FIG. 2. However, as shown, the C0 high pulse is significantly shorter. The phase detector 130 then locks the falling edge of the C180 signal with the rising edge of the C0 signal at time $t_2$, as shown by arrow 210. The phase detector 130 will lock the signals within a tolerance, shown by $\pm t_{PDmin}$ in FIG. 2. Due to the duty cycle distortion, the rising edge of the C180 signal is $t_{x1}$ off from time $t_1$, where the signal should be for a 180 degree phase difference. Accordingly, the C180 signal has been delayed $t_{x1}$ too much. Recall that adjusting the control voltage applied to the delay elements 105 of FIG. 1 adjusts the delay of all the delay elements 110a-d. The C360 signal will now be 2*$t_{x1}$ off from locked with C0, as shown in FIG. 2. The second step of operation of the phase detector 130 will be to adjust the delay of the delay elements 110a-d such that the C360 signal is synchronized with the C0 signal, by matching the rising edge of the C0 signal with the rising edge of the C360 signal, as shown in the second timing diagram of FIG. 2 by the arrow 220.

Duty cycle distortion in incoming clock signals is not uncommon, and, taking signal jitter into consideration, could be a significant portion of reference clock period. With duty cycle distortion, the two-step locking phase detector 130 may cease to function properly. The delay line 105 may have insufficient range to accommodate the lengthy $t_{x1}$ and 2*$t_{x1}$ delay times that should be compensated for according to FIG. 2. One solution to this problem is to place a duty-cycle control element prior to and in series with the multi-phase clock signal generator 100. This may ensure the multi-phase clock signal generator receives a clock signal with a correct duty cycle. However, a duty cycle control element also has a limited working range and takes much longer time to achieve corrected output signals. Accordingly, this solution may also become impractical as speeds increase and timing requirements tighten.

There is accordingly a need for an improved system and method for providing multi-phase clock signals.

BRIEF DESCRIPTION OF THE DRAWINGS

FIG. 4 is a timing diagram illustrating the operation of the signal generator of FIG. 3.

FIG. 5 is a timing diagram illustrating the operation of another embodiment of the signal generator of FIG. 3.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 3:
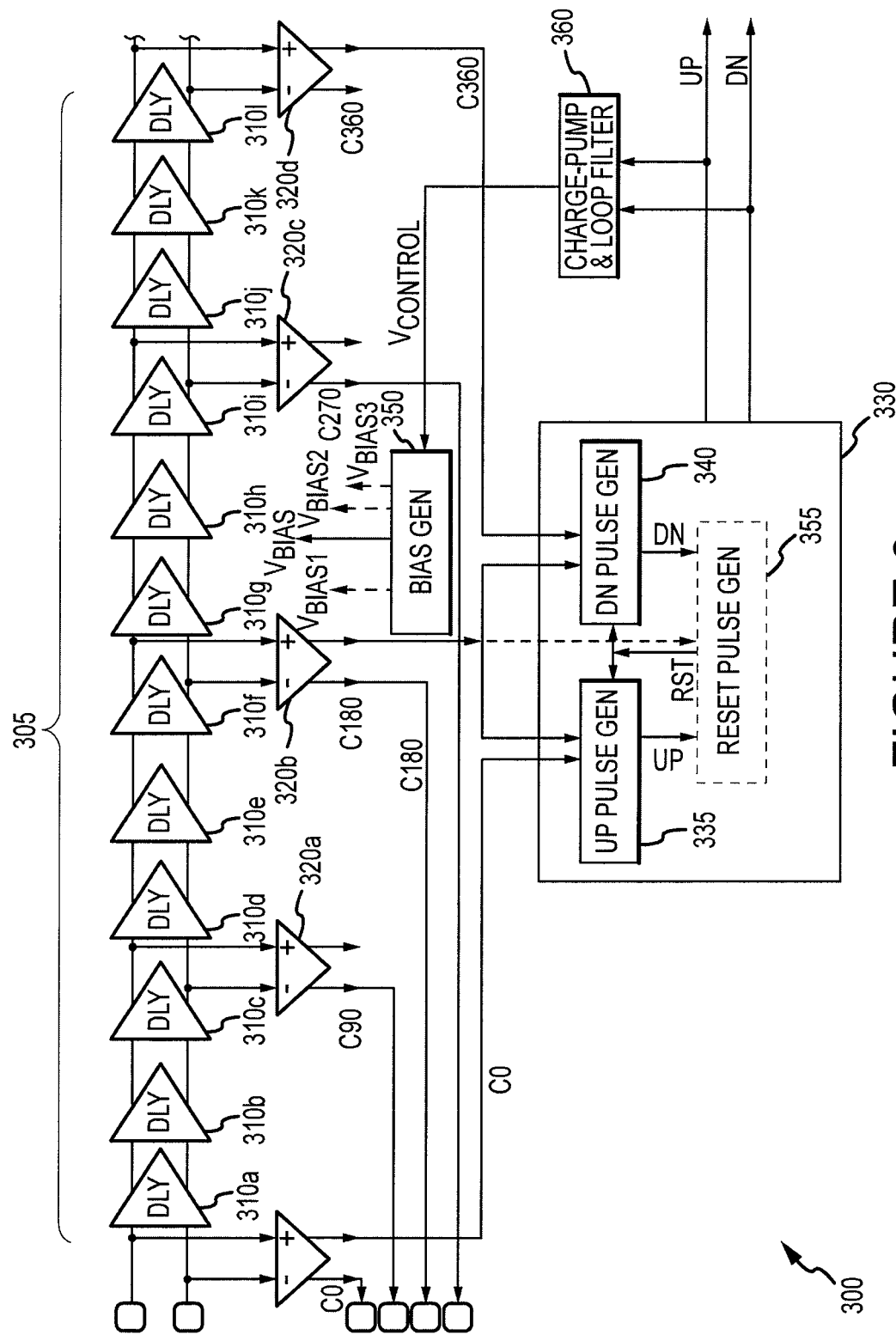
FIG. 3 is a schematic diagram of a multi-phase clock signal generator according to an embodiment of the present invention.

An embodiment of a multi-phase clock signal generator 300 according to an embodiment of the present invention is shown schematically in FIG. 3. While one delay element per tap may be used in some embodiments of the present invention, as was described above with reference to FIG. 1, the delay line 305 of FIG. 3 includes twelve delay elements 310a-l. Three delay elements are provided for each tap 320a-d. Using multiple delay elements per tap may allow greater flexibility in the range of delay that can be provided by the delay line 305. For example, the bias generator 350 may produce one bias voltage, $V_{BIAS}$, that adjusts each of the delay elements 310a-l the same amount. However, in some embodiments, the bias generator 350 may produce several bias voltages, shown as $V_{BIAS1}$, $V_{BIAS2}$, and $V_{BIAS3}$ in FIG. 3. Each bias voltage may adjust a different set of delay elements 310a-l. For example, delay elements 310a, d, g, and j may be controlled by $V_{BIAS1}$ and have a large range to provide course control of the delay of the delay line 305. Delay elements 310b, e, h, and k may be controlled by $V_{BIAS2}$ and have a medium range to provide medium range control of the delay of the delay line 305. Delay elements 310c, f, i, and l may be controlled by $V_{BIAS3}$ and may have a small range to provide fine control of the delay of the delay line 305. In this manner, a larger range of delay with adaptive wide range and timing delay resolution may be achieved.

Although four taps 320a-d are shown in FIG. 3 to provide quadrature clock signals, any number of signals may be generated according to embodiments of the present invention having any phase relationship with the incoming signal, C0. Similarly, although three delay elements are shown in the delay line 305 for each tap 320a-d, any number of delay elements may be used for each tap, including more than three delay elements and less than three delay elements.

Figure 1:
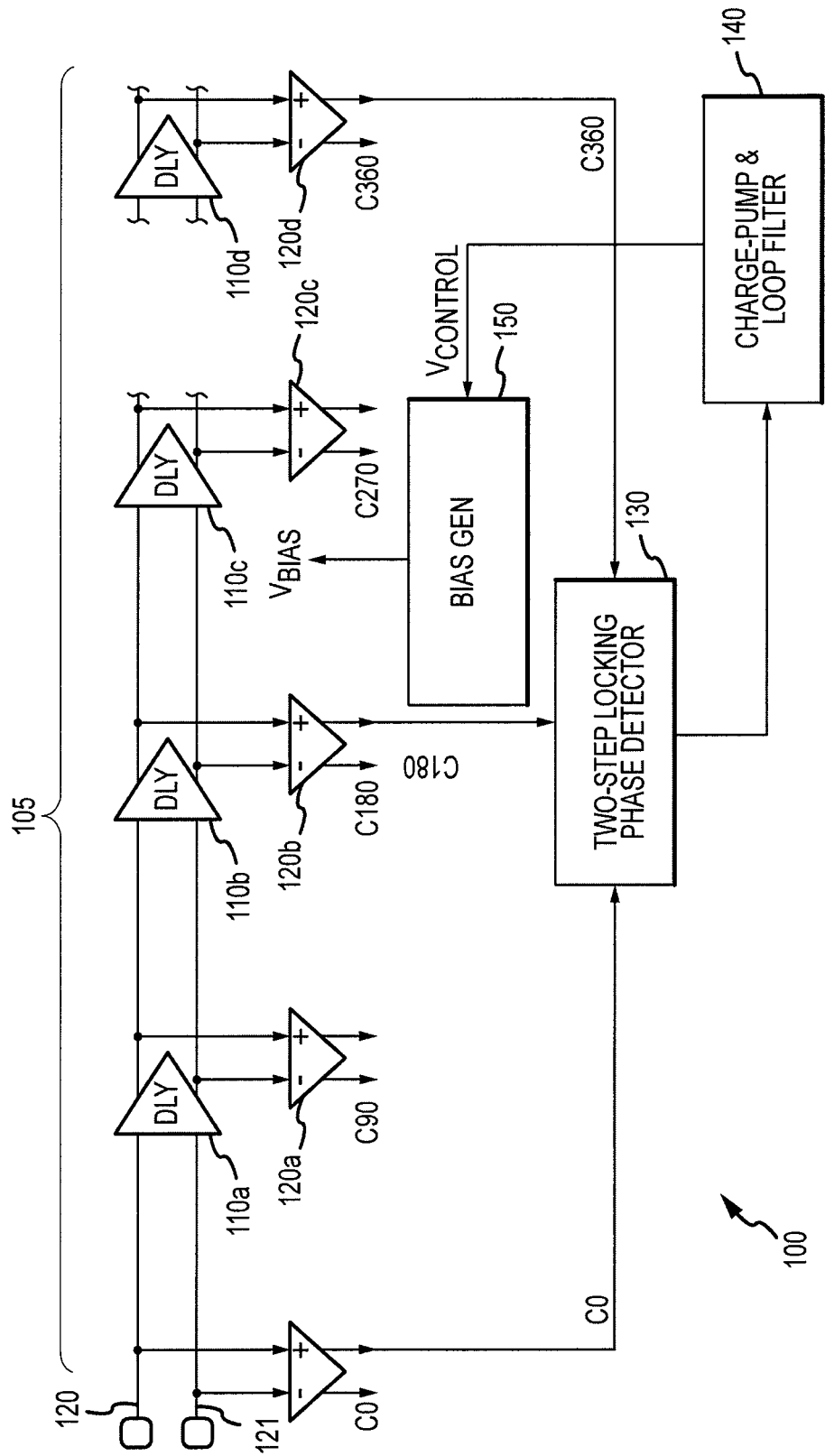
FIG. 1 is a schematic diagram of a multi-phase clock signal generator according to the prior art.
Figure 2:
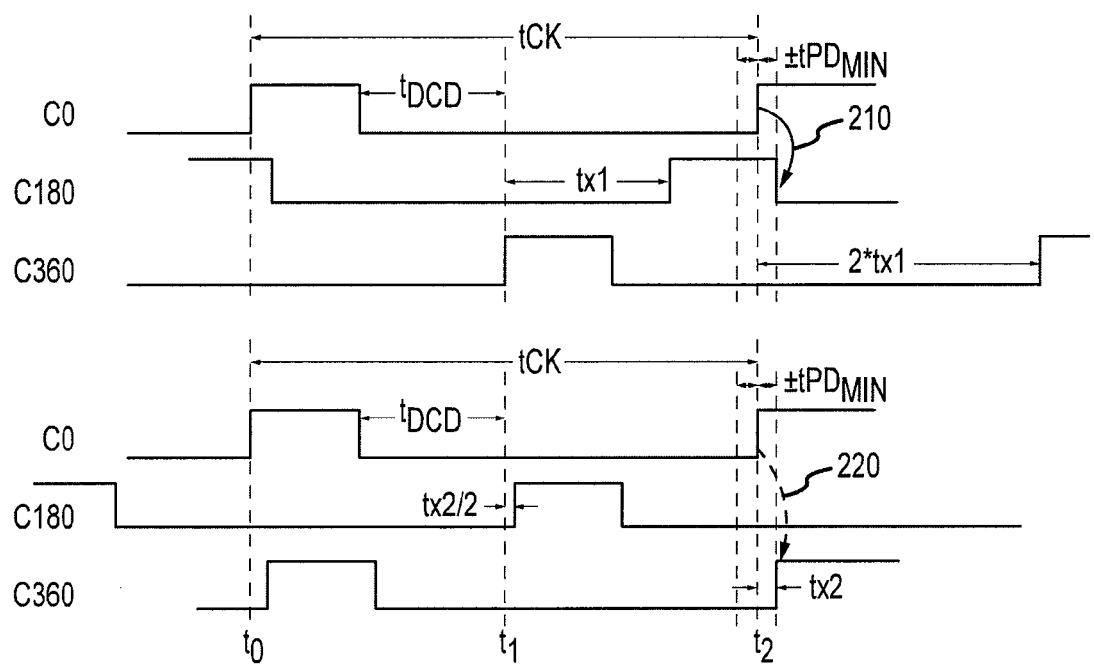
FIG. 2 is a timing diagram illustrating the operation of the clock signal generator of FIG. 1.

The phase detector 330 of FIG. 3 is configured to provide an adjustment signal to lock the C0, C180 and C360 signals in a single adjustment, in contrast to the two-step process performed by the phase detector 130 of FIG. 1. The operation of the phase detector 330 will now be discussed with reference to the timing diagram of FIG. 4.

The phase detector 330 includes a first pulse generator 335 (labeled 'UP Pulse Gen' in FIG. 3) and a second pulse generator 340 (labeled 'DN Pulse Gen' in FIG. 3). The first pulse generator 335 generates the UP signal 410 shown in FIG. 4. The UP signal is high from the rising edge of the C180 signal until the rising edge of the C0 signal, times 415 and 420, respectively, in FIG. 4. The second pulse generator 340 generates the DN signal 430 shown in FIG. 4. The DN signal is high from the rising edge of the C180 signal until the rising edge of the C360 signal, times 415 and 435, respectively in FIG. 4. As is described further below, the UP and DN signals are coupled to the charge-pump and loop filter 360 and are used to configure delay of the delay line 305 by adjusting the delay of one or more of the delay elements 310a-l such that the UP and DN signals are equal, indicating the C0, C180, and C360 signals are in synch with one another.

In this manner, once the C0, C180, and C360 signals are synchronized, the UP and DN signals will be equal and will each have a 50 percent duty cycle, because the signals will rise at the rising edge of C180, which will occur at one-half the clock period, $t_{CK}$, in FIG. 4, and will fall at the rising edge of C0 and C360, respectively, which will occur at the end of the clock cycle. Accordingly, the phase detector 330 in FIG. 3 itself generates a 50 percent duty cycle signal at the clock frequency $t_{CK}$. The UP and DN signals may accordingly themselves be used as clock signals in some embodiments.

Operation of an embodiment of the phase detector 330 has been described above with reference to the timing diagram of FIG. 4. However, the embodiment described above utilizes UP and DN signals which contain pulses truncated (e.g. terminating) at a rising edge of the C0 and C360 signals, respectively. Waiting for the next rising edge of the C0 and C360 signals to truncate the pulse of the UP and DN signals, respectively, may interfere with phase comparison measurements in a next clock cycle in some embodiments. For example, as the clock frequency increases, if the UP or DN signal is too long initially it may interfere with accurate phase measurements during a next clock cycle. Also, it takes a finite amount of adjustment time to adjust a delay of the delay line 305 responsive to the UP and DN signals. Receipt and comparison of the UP and DN signals takes time, the charge pump and loop filter 350 takes time to react, as does the bias generator 350. Further time elapses as the delay of the delay line 305 is changed. If the clock period, $t_{CK}$, is short in compared to the time for the adjustment to occur, generally, less than about two times the adjustment time, then the adjustment made by the charge-pump and loop filter 350 may not be visible by the phase detector 330 in the next comparison. Accordingly, it may be advantageous to make smaller adjustments to the delay of the delay line 305 to minimize any over- or under-shoot that may occur and not be observed until later clock cycles, at which point even further adjustments would have been made.

Accordingly, in some embodiments, a reset pulse generator 355 is coupled to the first and second pulse generators 335 and 340. The reset pulse generator 355 receives the UP and DN signals generated by the first and second pulse generators 335 and 340. The reset pulse generator 355 couples a reset signal, labeled Rst in FIG. 4, to the first and second pulse generators 355 and 340. Operation of an embodiment of the phase detector 330 including the reset pulse generator 355 will now be described with reference to the timing diagram of FIG. 5.

As shown in FIG. 5, the delay of the delay line 305 is too short such that the C180 signal rises at time 510, less than a quarter clock period after the C0 signal. Recall pulses of the UP and DN signals both begin at the rising edge of the C180 signal, time 510 in FIG. 5. Because of the insufficient delay between the C0 and C180 signals, in the embodiment shown in FIG. 5, the time between the rising edge of the C180 signal and the next rising edge of the C0 signal, time 515 in FIG. 5, is over three-quarters of a clock period. In the example above, the UP signal would contain a pulse having a width from the rising edge of the C180 signal to the next rising edge of the C0 signal. However, in the embodiment of FIG. 5, the reset pulse generator 355 is used to reduce the length of the UP pulse. The reset pulse generator 355 receives the rising edge of the UP and DN signals, or in some embodiments, receives the rising edge of the C180 signal. Following receipt of the rising edge of the C180 signal, the reset pulse generator 355 generates a reset pulse a delay time following the receipt of the next occurring rising edge—either the C0 or C360 signals. The reset pulse generator 355 may receive the C0 and C360 signals itself, or may detect the first rising edge by receipt of the falling edge of the UP or DN signal. With reference to FIG. 5, the rising edge of the C360 signal occurs first, at time 525, after the rising edge of the C180 signal, as indicated by the falling edge of the DN signal. Accordingly, reset pulse generator 355 generates a pulse at time 520, a delay time after receipt of the rising edge of the C360 signal. The reset signal is coupled to the UP pulse generator 335 and causes the UP pulse generator 335 to truncate the pulse at time 530. The DN and truncated UP signals are coupled to the charge pump and loop filter 360 and used to adjust the delay of the delay line 305. In this manner, the speed of the locking may be improved relative to the embodiment described above that did not employ a reset pulse generator 355.

In the second clock period, beginning at time 515 in FIG. 5, the delay of the delay line 305 has been changed in accordance with the UP and DN signals such that the C0 and C360 signals are closer to synchronization. The reset pulse generator 355 generates a pulse at time 550, a delay time after the rising edge of the C360 signal at time 555. However, the pulse at time 550 does not cause the UP pulse generator 335 to truncate the UP pulse because the UP pulse had already fallen at time 560 responsive the rising edge of the C0 signal. Accordingly, the reset pulse generator 355 causes either the first or second pulse generators 335 and 340 to truncate a generated pulse when the C0 and C360 signals are out of synchronization by greater than a threshold amount. When the C0 and C360 signals are closer together than the threshold amount, the reset pulse does not affect operation of the first and second pulse generators 335 and 340. As discussed above, and will be discussed further below, the charge-pump and loop filter 360 is configured to output a control signal responsive to the UP and DN signals to adjust the delay of the delay line 305 to minimize a difference between the UP and DN signals such that when the C0 and C360 signals are in synchronization, the UP and DN signals are equal and each have a 50 percent duty cycle. In some embodiments, the UP and DN signals themselves may be used as clock signals.

Note that, when the pulse widths of the UP and DN signals are equivalent, the C0 and C360 signals are locked, that is, the phase difference between the C0 and C360 signals is zero. Accordingly, the charge-pump and loop filter 360 are configured to configure the delay based on a difference of pulse widths between the UP and DN signals to minimize the phase difference between the C0 and C360 signals. For example, the $V_{CONTROL}$ signal may indicate to the bias generator 350 to increase the delay of the delay line 305 during a period when the UP signal is high and the DN signal low. The $V_{CONTROL}$ signal may indicate to the bias generator 350 to decrease the delay of the delay line 305 during a period when the UP signal is low and the DN signal high. The $V_{CONTROL}$ signal may indicate to the bias generator 350 to maintain the delay of the delay line 305 when the UP and DN signals have the same level. The charge-pump and loop filter 360 may be implemented in any of a variety of ways. For example, in one embodiment the loop filter may be implemented as a capacitor. The charge pump may include a current source which charges the capacitor responsive to the UP signal being high while the DN signal is low. The charge pump may further include a current sink which discharges the capacitor responsive to the UP signal being low while the DN signal is high. The charge pump would not effect the capacitor when the UP and DN signals had the same state. In this manner, the capacitor builds a voltage which may be, or be used to generate, the $V_{CONTROL}$ signal.

Figure 6:
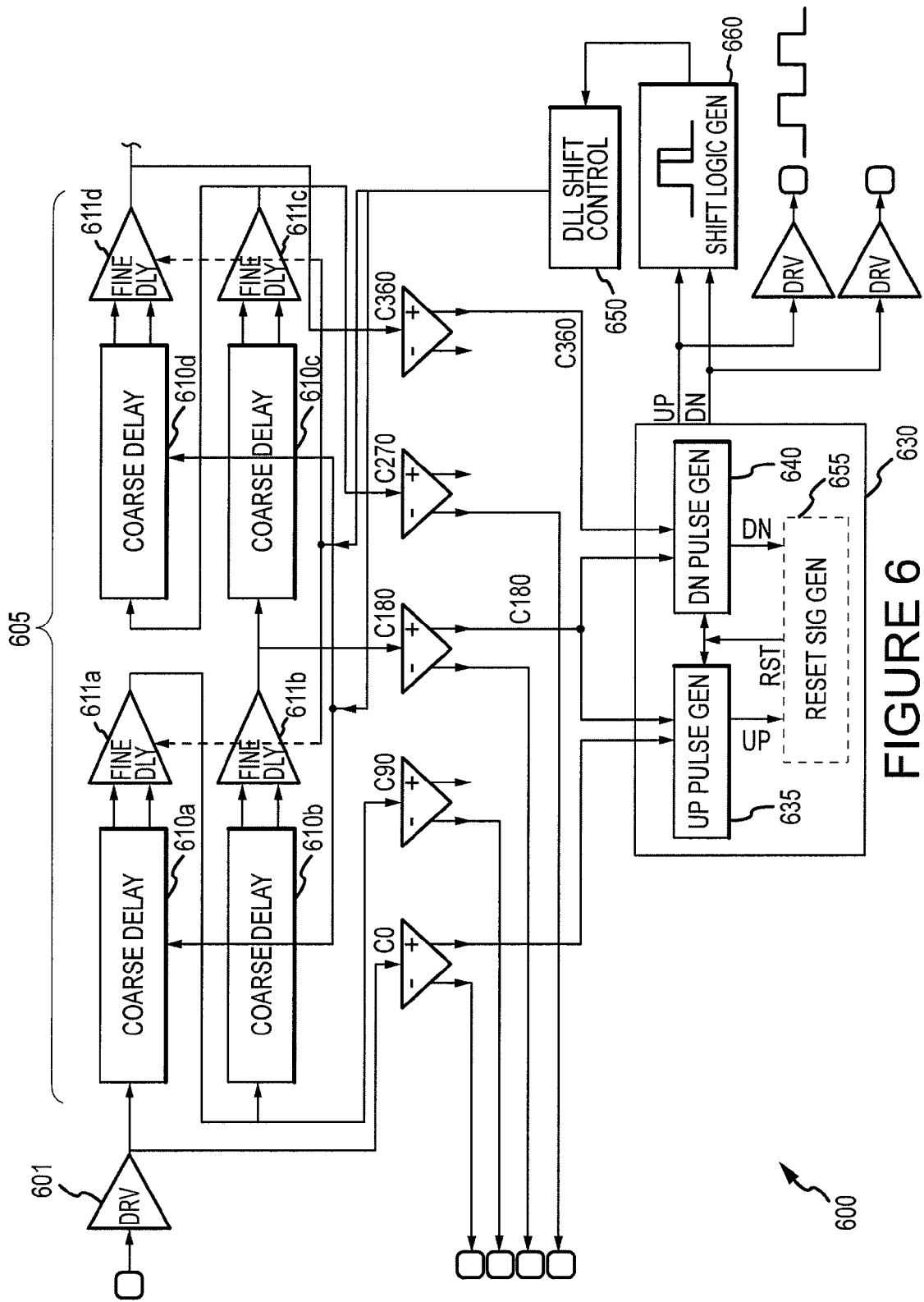
FIG. 6 is a schematic diagram of a multi-phase clock signal generator according to an embodiment of the present invention.

The embodiments described above employed an analog implementation of a multi-phase generator 300. However, a digital implementation may also be used, as shown as the digital multi-phase generator 600 in FIG. 6. In the embodiment of FIG. 6, an input clock signal is received by a driver 601 and coupled to a delay line 605. The delay line 605 includes digital coarse delay elements 610a-d and digital fine delay elements 611a-d. As discussed with the delay elements 310a-l above, and number of coarse and fine delay elements may be used. While in some embodiments delay elements having different ranges (such as coarse and fine) are used, in other embodiments, all delay elements have a same range. Further, in some embodiments, delay elements may be used having more than two different ranges (such as coarse, mid, and fine).

In the embodiment of FIG. 6, a tap in the delay line 605 occurs following each fine delay element 611a-d, resulting in the C90, C180, C270, and C360 signals as shown. The phase detector 630 includes a first pulse generator 635 configured to generate an UP signal, in an analogous manner as described above with reference to FIGS. 3-5. The phase detector 630 further includes a second pulse generator 640 configured to generate a DN signal, in an analogous manner as described above with reference to FIGS. 3-5. The phase detector 630 further includes an optional reset signal generator 655 configured to generate a reset signal in an analogous manner as described above with reference to FIGS. 3-5. The UP and DN signals are used by a shift logic generator 660 to generate a control signal to adjust the delay of the delay line 605. A shift control 650 generates the digital signals for adjusting the delay of delay line 605, and it may include a first signal used to adjust a delay of the coarse delay elements and a second signal used to adjust a delay of the fine delay elements, as shown in FIG. 6.

Figure 7:
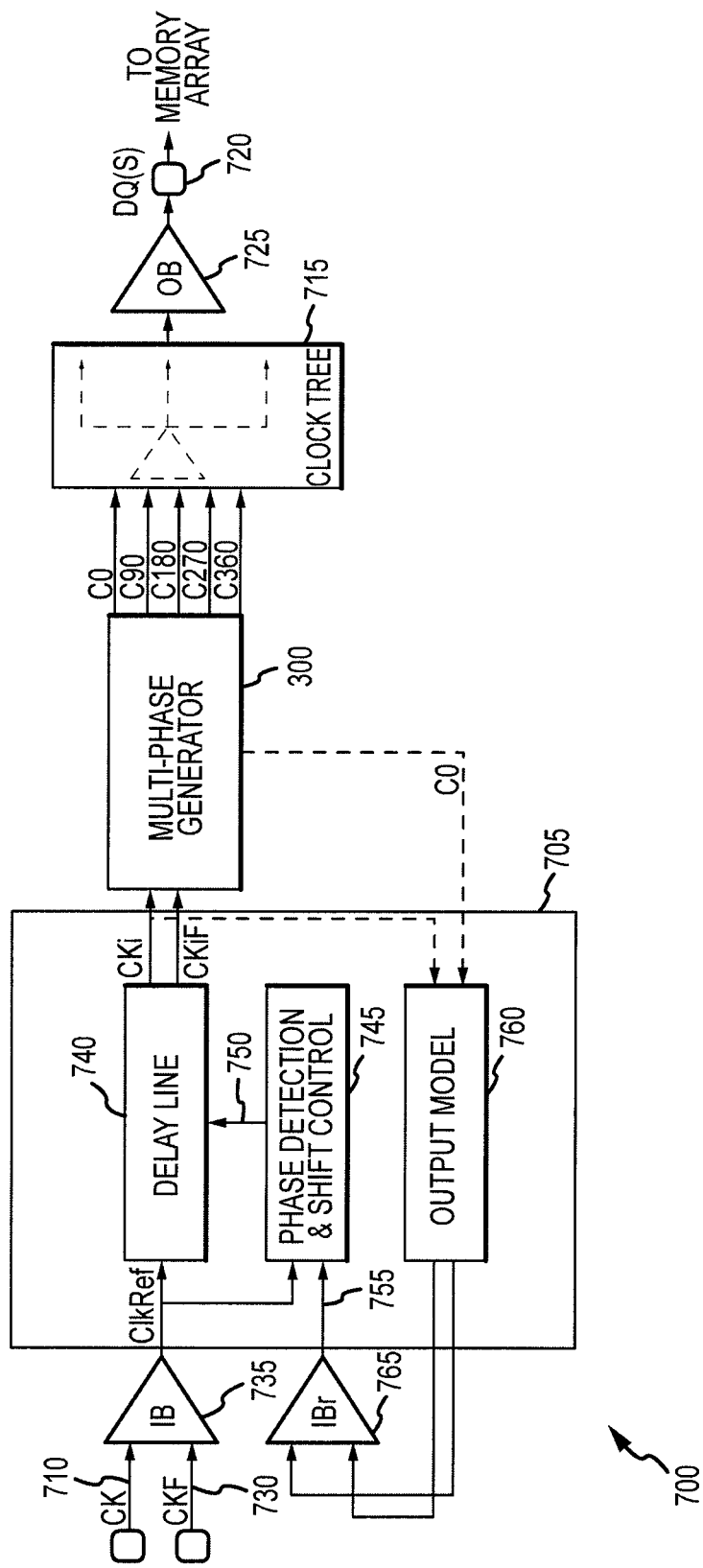
FIG. 7 is a schematic diagram of a portion of a memory device according to an embodiment of the present invention.

FIG. 7 depicts a portion of a memory device 700. The memory device receives a clock signal CK 710 and complementary clock signal CKF 730. The CK and CKF signals may be coupled to the memory device 700 by a memory controller, processor, or other electronic element. The multi-phase clock signal generator 300 of FIG. 3 is coupled to a delay locked loop 705 for use in locking the output signals of the multi-phase clock signal generator to the received clock signal CK 710. The received clock signal 710 and optional complementary signal 730 are coupled to an input buffer 735. For example, the input buffer 735 may receive the clock signals 710 and 730 from off-chip, or from another portion of a chip than the input buffer 735. The input buffer 735 couples the buffered ClkRef signal to the delay lock loop 705. The delay lock loop 705 includes a delay line 740 and a phase detection and shift control element 745. The delay line is configured and controlled by the phase detection and shift control element 745 to output a clock signal CKi, and optionally a complementary clock signal CKiF that are in phase with the ClkRef signal. The phase detection and shift control element 745 couples a control signal 750 to the delay line 740 to adjust the delay of the delay line 740 to minimize a phase difference between the ClkRef signal and a feedback signal 755. The feedback signal 755 may be based on either one of the signals generated by the multi-phase clock signal generator 300 (C0 as shown in FIG. 7), or the input signal CKi to the multi-phase clock signal generator 300, as indicated by the dashed lines in FIG. 7. In this manner, the multi-phase clock signal generator 300 may be either inside of the delay-locked loop 705 (when the signal C0 is used as the feedback signal) or outside of the delay locked loop 705 (when the CKi signal is used).

FIG. 7 also illustrates the output signals of the multi-phase clock signal generator 300 (the signals C0, C90, C180, C270, and C360) coupled to a clock tree 715 for distribution to the DQ(s) 720 of the memory device 700. In this manner, the clock signals generated by the multi-phase clock signal generator may be used to clock operation of the DQ(s) 720. Although distribution to a DQ 720 is shown in FIG. 7, the clock signals from the multi-phase clock signal generator 300 may generally be coupled to any number of DQs. Further, output signals of the multi-phase clock signal generator 300 may additionally or instead be coupled to other elements of the memory device 700 or other electronic system employing the multi-phase clock signal generator 300. An output buffer 725 may be provided at each destination to couple one or more of the clock signals to the destination, such as DQ 720.

The feedback signal used by the phase detection and shift control element 745 may be coupled to one or more model delay elements, including the output model element 760 and the buffer delay element 765 shown in FIG. 7. The buffer delay element 765 models the delay of the input buffer 735. The output model delay element 760 models the delay of an output path between the point the feedback signal was generated, and the destination of the signal generated by the multi-phase clock signal generator 300 (the clock tree 715 and the output buffer 725 in the example of FIG. 7). By delaying the feedback signal by an amount equal to the delay of the output path, the delay locked-loop minimizes the phase difference between the output signal arriving at the DQ 720 and the input clock signal 710.

Figure 8:
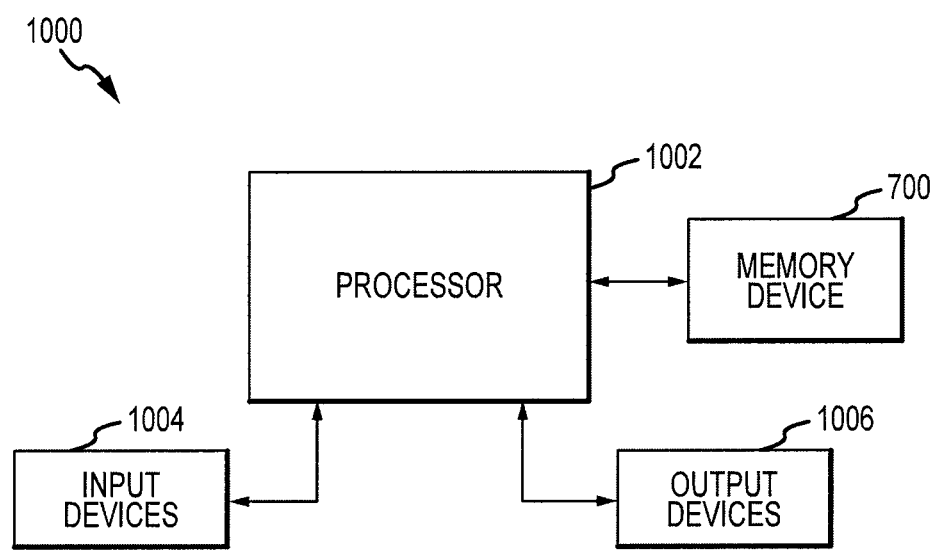
FIG. 8 is a schematic diagram of a processor-based system according to an embodiment of the present invention.

FIG. 8 is a block diagram of a processor-based system 1000 including processor 1002 that communicates with a memory device 700. The memory device 700 may be integral with or physically separate from the processor 1002 and communication between the two may take place in any manner. The memory device 700 may contain one or more multi-phase clock signal generators 300 to generate clock signals having various phases in accordance with embodiments of the invention described above. Typically, the processor 1002 is coupled through address, data, and control buses to the memory device 700 to provide for writing data to and reading data from one or more memory arrays in the memory device 700. The processor 1002 may include circuitry for performing various processing functions, such as executing specific software to perform specific calculations or tasks. In addition, the processor-based system 1000 includes one or more input devices 1004, such as a keyboard or a mouse, coupled to the processor 1002 to allow a user to interface with the processor-based system 1000. Typically, the processor-based system 1000 also includes one or more output devices 1006 coupled to the processor 1002, such as a printer or display. One or more data storage devices may also be coupled to the processor 1002 to store data or retrieve data from external storage media (not shown). Examples of such storage devices include hard and floppy disks, tape cassettes, compact disk read-only ("CD-ROMs") and compact disk read-write ("CD-RW") memories, and digital video disks ("DVDs").

The processor-based system 1000 shown in FIG. 8 may be implemented in any of a variety of products employing processors and memory including for example cameras, phones, wireless devices, displays, chip sets, set top boxes, gaming systems, vehicles, and appliances. Resulting devices employing the processor-based system 1000 may benefit from the embodiments of a multi-phase clock signal generator described above to perform their ultimate user function.

From the foregoing it will be appreciated that, although specific embodiments of the invention have been described herein for purposes of illustration, various modifications may be made without deviating from the spirit and scope of the invention. For example, although the generation of quadrature clock signals has been discussed and described, embodiments of the invention may generate substantially any number of clock signals having any phase relationship therebetween by, for example, adjusting a number of identical delay elements per tap in the delay line generating the clock signals. Further, although analog embodiments are shown and described above, other embodiments of the present invention may be implemented using one or more digital components.

What is claimed is:

1. A multi-phase periodic signal generator comprising:
   a delay line configured to receive an input signal and delay the input signal to generate an intermediate signal, the delay line further configured to delay the intermediate signal to generate an output signal;
   a first pulse generator configured to receive the input and intermediate signals and generate a first pulse having a width corresponding to a time between a rising edge of the intermediate signal and a next rising edge of the input signal; and
   a second pulse generator configured to receive the intermediate and output signals and generate a second pulse having a width corresponding to a time between a rising edge of the intermediate signal and a next rising edge of the output signal;
   wherein a delay of the delay line is configured to be increased responsive to the first pulse having a first state and the second pulse having a second state and decreased responsive to the first pulse having the second state and the second pulse having the first state.

2. The multi-phase periodic signal generator of claim 1, wherein at least one of the first pulse and the second pulse is a duty-cycle corrected clock signal.

3. The multi-phase periodic signal generator of claim 1, wherein the intermediate signal has a 180 degree phase difference from at least one of the input signal and the output signal.

4. The multi-phase periodic signal generator of claim 1, further comprising:
   a bias generator configured to generate a bias signal responsive to the first pulse and the second pulse;
   wherein the delay of the delay line is responsive, to the bias signal.

5. The multi-phase periodic signal generator of claim 1, wherein the intermediate signal is a first intermediate signal and the delay line is further configured to delay the first intermediate signal to generate a second intermediate signal.

6. The multi-phase periodic signal generator of claim 5, wherein the input signal and the second intermediate signal have a phase difference of 270 degrees.

7. The multi-phase periodic signal generator of claim 1, further comprising:
   a reset generator coupled to the first and second pulse generators and configured to receive the first and second pulses, the reset generator further configured to output a reset signal responsive to the input and output signals having a phase difference greater than a threshold amount.

8. A memory device, comprising:
   an input buffer configured to receive an input signal and output a reference signal based on the input signal; and
   a multi-phase signal generator coupled to the input buffer, including:
      a delay line configured to receive the reference signal, the delay line configured to generate first and second delay signals responsive to the reference signal;
      a first pulse generator configured to receive the reference and first delay signals and generate a first pulse having a width corresponding to a time between a rising edge of the second delay signal and a next rising edge of the first delay signal; and
      a second pulse generator configured to receive the first and second delay signals and generate a second pulse having a width corresponding to a time between a rising edge of the second delay signal and a next rising edge of the third delay signal,
      wherein a delay of the delay line is configured to be increased responsive to the first pulse having a first state and the second pulse having a second state and decreased responsive to the first pulse having the second state and the second pulse having the first state.

9. The memory device of claim 8, wherein the delay line comprises at least one coarse delay element and at least one fine delay element.

10. The memory device of claim 8, further comprising:
    a control signal generator coupled to the first and second pulse generators and configured to receive the first and second pulses, the control generator further configured to generate a control signal;
    wherein a delay of the delay line is responsive to the control signal.

11. The memory device of claim 10, wherein the control signal generator is a shift logic generator.

12. The memory device of claim 8, wherein at least one of the first pulse and the second pulse is a duty-cycle corrected clock signal.

13. The memory device of claim 8, wherein the first and second delay signals have a phase difference of 180 degrees.

14. The memory device of claim 8, wherein the first and second pulse generators are further configured to lock at least one of the input, intermediate, and output signals.

15. A method of generating a plurality of clock signals, comprising:
    generating an intermediate signal and an output signal responsive, to an input signal;
    generating a first pulse having a width corresponding to a time between a rising edge of the intermediate signal and a next rising edge of the input signal;
    generating a second pulse having a width corresponding to a time between a rising edge of the intermediate signal and a next rising edge of the output signal;
    increasing the delay of a delay line responsive to the first and second pulses having first and second states, respectively; and
    decreasing the delay of the delay line responsive to the first and second pulses having the second and first states, respectively.

16. The method of claim 15, wherein said generating an intermediate signal and an output signal, comprises:
    delaying the input signal to generate the intermediate signal; and
    delaying the intermediate signal to generate the output signal.

17. The method of claim 15, further comprising:
    generating a reset signal responsive to the input and output signals having a phase difference greater than a threshold amount.

18. The method of claim 15, wherein said increasing the delay of a delay line, comprises:
    providing a voltage bias to the delay line.

19. The method of claim 15, wherein at least one of the first and second pulses is a duty-cycle corrected clock signal.

20. The method of claim 15, wherein said decreasing the delay of a delay line, comprises:
   providing a control signal to the delay line.

* * * * *